(12) United States Patent
Tseng et al.

(10) Patent No.: US 10,925,172 B1
(45) Date of Patent: Feb. 16, 2021

(54) CARRIER STRUCTURE AND MANUFACTURING METHOD THEREOF

(71) Applicant: Unimicron Technology Corp., Taoyuan (TW)

(72) Inventors: Tzyy-Jang Tseng, Taoyuan (TW); Cheng-Ta Ko, Taipei (TW); Pu-Ju Lin, Hsinchu (TW); Tse-Wei Wang, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/702,478

(22) Filed: Dec. 3, 2019

(30) Foreign Application Priority Data

Oct. 24, 2019 (TW) .................................. 108138473

(51) Int. Cl.
| H05K 3/46 | (2006.01) |
| H05K 1/11 | (2006.01) |
| H05K 3/40 | (2006.01) |
| H05K 1/03 | (2006.01) |

(52) U.S. Cl.
CPC ......... *H05K 3/4644* (2013.01); *H05K 1/0306* (2013.01); *H05K 1/112* (2013.01); *H05K 3/4007* (2013.01); *H05K 3/4038* (2013.01); *H05K 2201/0175* (2013.01)

(58) Field of Classification Search
CPC .... H05K 3/4644; H05K 3/4602; H05K 1/112; H05K 1/111; H05K 1/0298; H05K 1/0268
See application file for complete search history.

(56) References Cited

U.S. PATENT DOCUMENTS

| 2005/0088833 A1* | 4/2005 | Kikuchi ............ H01L 23/49822 361/763 |
| 2010/0065959 A1* | 3/2010 | Horiuchi ........... H01L 23/49822 257/692 |
| 2014/0014399 A1* | 1/2014 | Kariya ..................... H05K 1/02 174/250 |
| 2015/0041205 A1* | 2/2015 | Chien .................. H05K 3/4602 174/264 |

(Continued)

FOREIGN PATENT DOCUMENTS

| CN | 109427726 | 3/2019 |
| TW | I531038 | 4/2016 |

*Primary Examiner* — Timothy J Thompson
*Assistant Examiner* — Amol H Patel
(74) *Attorney, Agent, or Firm* — JCIPRNET

(57) ABSTRACT

A carrier structure includes a carrier having at least one through hole penetrating the carrier and a build-up circuit layer located on the carrier and including at least one first circuit layer, at least one first dielectric layer, a second circuit layer, a second dielectric layer, and a plurality of conductive vias. The first circuit layer is located on a first surface of the carrier and includes at least one first pad disposed relative to the through hole. The first dielectric layer is located on the first circuit layer. The second circuit layer is located on the first dielectric layer and includes at least one second pad. The second dielectric layer is located on the second circuit layer and includes at least one opening exposing the second pad. The conductive vias penetrate the first dielectric layer and are electrically connected to the first and second circuit layers.

8 Claims, 6 Drawing Sheets

(56) References Cited

U.S. PATENT DOCUMENTS

2015/0327362 A1* 11/2015 Maeda ................. H05K 3/4647
                                                    361/761
2019/0059153 A1*  2/2019 Liu ...................... H05K 3/244
2019/0059154 A1*  2/2019 Liu ...................... H05K 3/4682

* cited by examiner

CARRIER STRUCTURE AND MANUFACTURING METHOD THEREOF

CROSS-REFERENCE TO RELATED APPLICATION

This application claims the priority benefit of Taiwan application serial no. 108138473, filed on Oct. 24, 2019. The entirety of the above-mentioned patent application is hereby incorporated by reference herein and made a part of this specification.

BACKGROUND OF THE INVENTION

1. Field of the Invention

The invention relates to a carrier structure and a manufacturing method thereof, and in particular, to a carrier structure and a manufacturing method thereof that may be used to detect whether a circuit is shorted or open.

2. Description of Related Art

Currently, during manufacture of a plurality of single-sided fine line redistribution layers on a carrier, one endpoint of a circuit is hidden between the redistribution layer and the carrier. Therefore, after the redistribution layer is manufactured, short-circuit or open-circuit electrical detection may be performed on only the other endpoint of the circuit to detect a problem in a manufacturing process of the circuit. However, if the circuit is fine and an open circuit occurs near the endpoint, the problem in the manufacturing process may not be detected.

SUMMARY OF THE INVENTION

The invention provides a carrier structure and a manufacturing method thereof that may be used to detect whether a circuit is shorted or open, which are relatively reliable.

The carrier structure of the invention includes a carrier and a build-up circuit layer. The carrier includes a first surface, a second surface opposite to the first surface, and at least one through hole penetrating the carrier. The build-up circuit layer is located on the carrier. The build-up circuit layer includes at least one first circuit layer, at least one first dielectric layer, a second circuit layer, a second dielectric layer, and a plurality of conductive vias. The first circuit layer is located on a first surface of the carrier and includes at least one first pad. The first pad is disposed relative to the through hole. The first dielectric layer is located on the first circuit layer. The second circuit layer is located on the first dielectric layer and includes at least one second pad. The second dielectric layer is located on the second circuit layer and includes at least one opening. The opening exposes the second pad. The conductive via penetrates the first dielectric layer and is electrically connected to the first circuit layer and the second circuit layer.

In an embodiment of the invention, the carrier structure further includes a connecting layer. The connecting layer is located between the carrier and the build-up circuit layer and covers the through hole.

In an embodiment of the invention, the connecting layer is in direct contact with the first pad in the build-up circuit layer.

In an embodiment of the invention, the connecting layer is made of a material including an anisotropic conductive adhesive.

In an embodiment of the invention, the carrier structure further includes at least one conductive pad. The conductive pad includes a top surface and a bottom surface opposite to the top surface. The conductive pad is located between the carrier and the build-up circuit layer, and is covered by the connecting layer. The conductive pad is disposed relative to the through hole.

In an embodiment of the invention, the bottom surface of the conductive pad is aligned with the first surface of the carrier.

In an embodiment of the invention, the top surface of the conductive pad is in direct contact with the first pad.

In an embodiment of the invention, the conductive pad is electrically connected to the first pad through the connecting layer.

In an embodiment of the invention, the carrier structure further includes a plurality of conductive pillars. The plurality of conductive pillars is disposed between the conductive pad and the build-up circuit layer and is electrically connected to the conductive pad and the first pad.

In an embodiment of the invention, the first circuit layer and the second circuit layer are fine lines. A thickness of each of the first dielectric layer and the second dielectric layer is from 4 microns to 10 microns.

A manufacturing method of a carrier structure provided by the invention includes the following steps. First, a first carrier is provided. The carrier includes a first surface, a second surface opposite to the first surface, and at least one through hole penetrating the carrier. Next, a build-up circuit layer is formed on the carrier. The build-up circuit layer includes at least one first circuit layer, at least one first dielectric layer, a second circuit layer, a second dielectric layer, and a plurality of conductive vias. The first circuit layer is located on a first surface of the carrier and includes at least one first pad. The first pad is disposed relative to the through hole. The first dielectric layer is located on the first circuit layer. The second circuit layer is located on the first dielectric layer and includes at least one second pad. The second dielectric layer is located on the second circuit layer and includes at least one opening. The opening exposes the second pad. The conductive via penetrates the first dielectric layer and is electrically connected to the first circuit layer and the second circuit layer.

In an embodiment of the invention, the step of forming the build-up circuit layer on the carrier includes the following steps. First, a glass substrate is provided. Next, a release layer is formed on the glass substrate. Then the build-up circuit layer is formed on the release layer. Finally, the release layer and the glass substrate are removed to dispose the build-up circuit layer on the first surface of the carrier.

In an embodiment of the invention, before forming the build-up circuit layer on the carrier, the method further includes the following step. A connecting layer is formed between the carrier and the build-up circuit layer, so that the connecting layer covers the through hole.

In an embodiment of the invention, before forming the connecting layer between the carrier and the build-up circuit layer, the method further includes the following step. At least one conductive pad is formed between the carrier and the build-up circuit layer, so that the conductive pad is covered by the connecting layer. The conductive pad is disposed relative to the through hole. The conductive pad includes a top surface and a bottom surface opposite to the top surface.

In an embodiment of the invention, the manufacturing method of the carrier structure further includes the following step. A plurality of conductive pillars are formed between the conductive pad and the build-up circuit layer, so that the conductive pillar is connected to the conductive pad and the first pad.

Based on the above, according to the carrier structure and the manufacturing method thereof in the embodiments, the first pad may be electrically connected to the corresponding second pad through the conductive via and the first circuit layer, the first pad is exposed from the through hole, and the second pad is exposed from the second dielectric layer. Therefore, after the build-up circuit layer is manufactured, short-circuit or open-circuit detection may be performed on upper and lower endpoints of the build-up circuit layer, that is, the first pad (that is, the lower endpoint) and the corresponding second pad (that is, the upper endpoint), to detect whether there is a problem in a manufacturing process of the circuit. Therefore, the carrier structure and the manufacturing method thereof in the embodiments may be used to detect whether a circuit is shorted or open, so that the carrier substrate is relatively reliable.

DESCRIPTION OF THE EMBODIMENTS

Figure 1A:
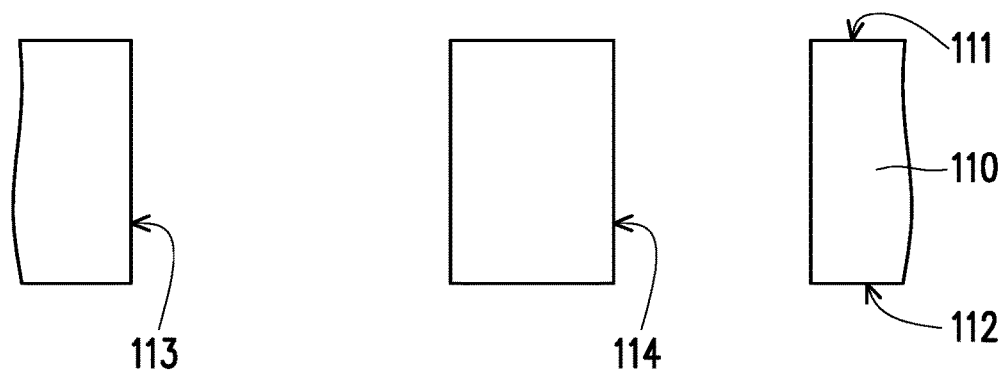
FIG. 1A to FIG. 1B are schematic cross-sectional views illustrating a manufacturing method of a carrier structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
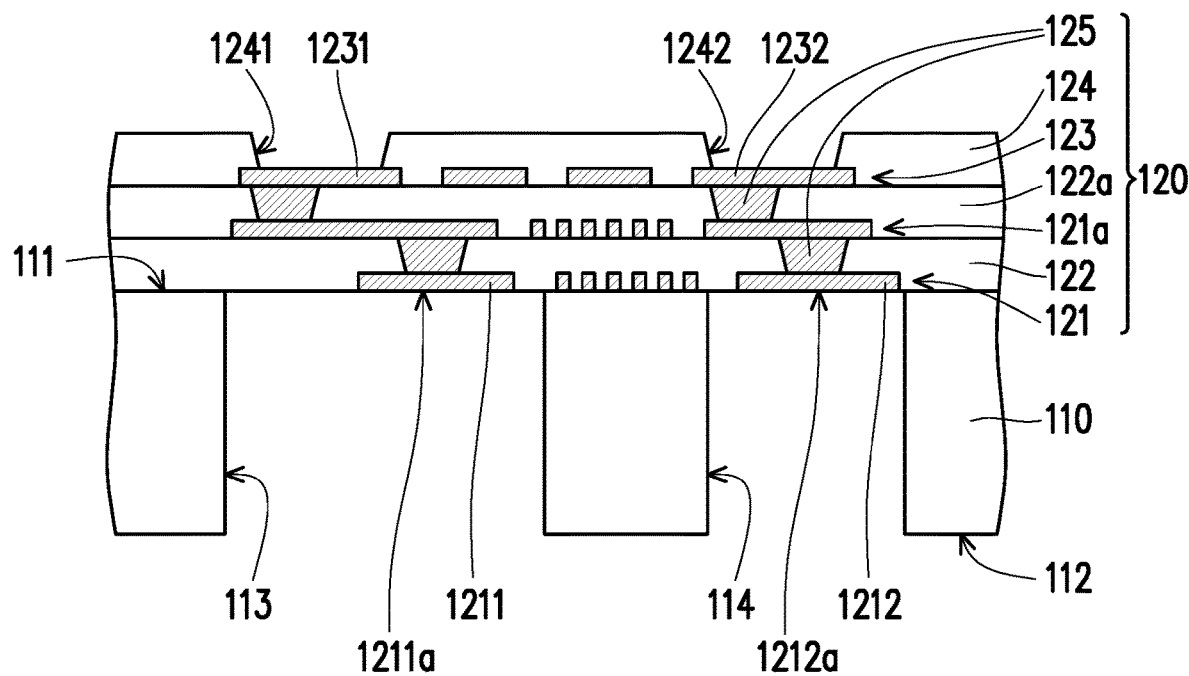

FIG. 1A to FIG. 1B are schematic cross-sectional views illustrating a manufacturing method of a carrier structure according to an embodiment of the invention. First, referring to FIG. 1A, a carrier 110 is provided. The carrier 110 includes a first surface 111, a second surface 112 opposite to the first surface 111, and at least one through hole 113 and 114 penetrating the carrier 110. Although two through holes 113 and 114 are schematically illustrated in FIG. 1, a number of through holes is not limited in the invention. In the present embodiment, the through holes 113 and 114 connect the first surface 111 and the second surface 112 of the carrier 110. The through holes 113 and 114 are formed, for example, through laser drilling or machining, but the invention is not limited thereto. In the present embodiment, the carrier 110 is made of, for example, a glass substrate, a ceramic substrate, a silicon substrate or a high polymer glass fiber composite substrate, but the invention is not limited thereto.

Next, referring to FIG. 1B, a build-up circuit layer 120 is formed on the carrier 110. In particular, in the present embodiment, for example, the build-up circuit layer 120 may be directly formed on the first surface 111 of the carrier 110. In some embodiments, before the build-up circuit layer 120 is formed, a filler (not shown) may be filled in the through holes 113 and 114, and then the build-up circuit layer 120 starts to be formed. The filler may be removed after the build-up circuit layer 120 is manufactured, to expose the through holes 113 and 114. In addition, in some embodiments, a mold (not shown) having a protrusion may be paired with the carrier 110 before the build-up circuit layer 120 is manufactured, so that the protrusion of the mold is inserted into the through holes 113 and 114, and then the build-up circuit layer 120 starts to be formed. The mold may be removed the build-up circuit layer 120 is manufactured, to expose the through holes 113 and 114.

In the present embodiment, the build-up circuit layer 120 may include at least one first circuit layer 121 and 121a, at least one first dielectric layer 122 and 122a, a second circuit layer 123, a second dielectric layer 124, and a plurality of conductive vias 125. In particular, the first circuit layer 121 is located on the first surface 111 of the carrier 110 and exposes a portion of the first surface 111 of the carrier 110. The first circuit layer 121 includes at least one first pad 1211 and 1212. The first pad 1211 is disposed relative to the through hole 113, and the first pad 1212 is disposed relative to the through hole 114. A bottom surface 1211a of the first pad 1211 and a bottom surface 1212a of the first pad 1212 are both aligned with the first surface 111 of the carrier 110. Although two first pads 1211 and 1212 adjacent to the carrier 110 are schematically illustrated in FIG. 1, a number of first pads adjacent to the carrier is not limited in the invention.

The first dielectric layer 122 is located on the first circuit layer 121 and covers the first circuit layer 121 and the first surface 111 of the carrier 110. Next, the first circuit layer 121a is located on the first dielectric layer 122 and exposes a portion of the first dielectric layer 122. The first dielectric layer 122a is located on the first circuit layer 121a and covers the first circuit layer 121a and the first dielectric layer 122. Although two first circuit layers 121 and 121a and two first dielectric layers 122 and 122a are schematically illustrated in FIG. 1, numbers of first circuit layers and first dielectric layers are not limited in the invention. In other words, in other embodiments, there may be more or two or more first circuit layers, and there may also be more or two or more first dielectric layers.

The second circuit layer 123 is located on the first dielectric layer 122a and exposes a portion of the first dielectric layer 122a. The second circuit layer 123 includes at least one second pad 1231 and 1232. The second pad 1231 is disposed relative to the through hole 113, and the second pad 1232 is disposed relative to the through hole 114.

The second dielectric layer 124 is located on the second circuit layer 123. The second dielectric layer 124 covers the first dielectric layer 122a and a portion of the second circuit layer 123. The second dielectric layer 124 includes at least one opening 1241 and 1242. The opening 1241 exposes the second pad 1231, and the opening 1242 exposes the second pad 1232. The opening 1241 is disposed relative to the through hole 113, and the opening 1242 is disposed relative to the through hole 114.

The conductive via 125 penetrates the first dielectric layer 122 and the first dielectric layer 122a. The conductive via 125 is electrically connected to the first circuit layer 121 and the first circuit layer 121a, and is electrically connected to the first circuit layer 121a and the second circuit layer 123. Therefore, the first pad 1211 may be electrically connected to the corresponding second pad 1231 through the conductive via 125 and the first circuit layer 121a, and the first pad 1212 may be electrically connected to the corresponding second pad 1232 through the conductive via 125 and the first circuit layer 121a. In some embodiments, the first pad 1211 is not electrically connected to the second pad 1232, and the first pad 1212 is not electrically connected to the second pad 1231. So far, the carrier structure 100 in the present embodiment is manufactured.

In addition, although the build-up circuit layer 120 is directly formed on the first surface 111 of the carrier 110 in the foregoing description, a manner of forming the build-up circuit layer is not limited in the invention. In some embodiments, a build-up circuit layer may be first formed on another substrate, and then a manufactured build-up circuit layer is disposed on the carrier. For example, the build-up circuit layer may be formed on the carrier (not shown) using the following steps. First, a glass substrate is provided. Next, a release layer is formed on the glass substrate. Then a build-up circuit layer is formed on the release layer. Finally, the release layer and the glass substrate are removed to dispose the manufactured build-up circuit layer on the first surface of the carrier. In addition, in some embodiments, the first circuit layers 121 and 121a and the second circuit layer 123 in the build-up circuit layer 120 may be fine lines. A width of the fine lines is, for example, 2 micrometers to 10 micrometers, and a thickness of each of the dielectric layer 122 and 122a and the second dielectric layer 124 is, for example, 4 micrometers to 10 micrometers, but the invention not limited thereto.

In short, the carrier structure 100 in the present embodiment includes the carrier 110 and the build-up circuit layer 120. The carrier 110 includes the first surface 111, the second surface 112 opposite to the first surface 111, and the through holes 113 and 114 penetrating the carrier 110. The build-up circuit layer 120 is located on the carrier 110. The build-up circuit layer 120 includes the first circuit layers 121 and 121a, the first dielectric layers 122 and 122a, the second circuit layer 123, the second dielectric layer 124, and the plurality of conductive vias 125. The first circuit layers 121 and 121a are located on the first surface 111 of the carrier 110, and the first circuit layer 121 includes first pads 1211 and 1212. The first dielectric layer 122 (or the first dielectric layer 122a) is located on the first circuit layer 121 (or the first circuit layer 121a). The second circuit layer 123 is located on the first dielectric layers 122 and 122a and includes the second pads 1231 and 1232. The second dielectric layer 124 is located on the second circuit layer 123 and includes the openings 1241 and 1242. The opening 1241 (or the opening 1242) exposes the second pad 1231 (or the second pad 1232). The conductive via 125 penetrates the first dielectric layers 122 and 122a and is electrically connected to the first circuit layers 121 and 121a and the second circuit layer 123. The first pad 1211 adjacent to the carrier 110 is disposed relative to the through hole 113, and the first pad 1212 adjacent to the carrier 110 is disposed relative to the through hole 114. The second pad 1231 is disposed relative to the through hole 113, and the second pad 1232 is disposed relative to the through hole 114.

In addition, according to the carrier structure 100 in the present embodiment, the first pad 1211 may be electrically connected to the corresponding second pad 1231 through the conductive via 125 and the first circuit layer 121a, the first pad 1211 is exposed from the through hole 113, and the second pad 1231 is exposed from the second dielectric layer 124. Therefore, after the build-up circuit layer 120 is manufactured, short-circuit or open-circuit electrical detection may be performed on upper and lower endpoints (that is, positions in contact with a probe during electrical detection) of the build-up circuit layer 120, that is, the first pad 1211 (that is, the lower endpoint) and the corresponding second pad 1231 (that is, the upper endpoint) using a probe, to detect whether there is a problem in a manufacturing process of the circuit. Similarly, short-circuit or open-circuit electrical detection may be further performed on the first pad 1212 and the corresponding second pad 1232. Therefore, the carrier substrate 100 in the present embodiment is relatively reliable.

It needs to be noted herein that in the following embodiments, reference numerals and a portion of the foregoing embodiments are used, and same reference numerals are used to represent same or similar elements, and descriptions about same technical content are omitted. For the omitted descriptions, refer to the foregoing embodiments, and details are not repeated again in the following embodiments.

Figure 2A:
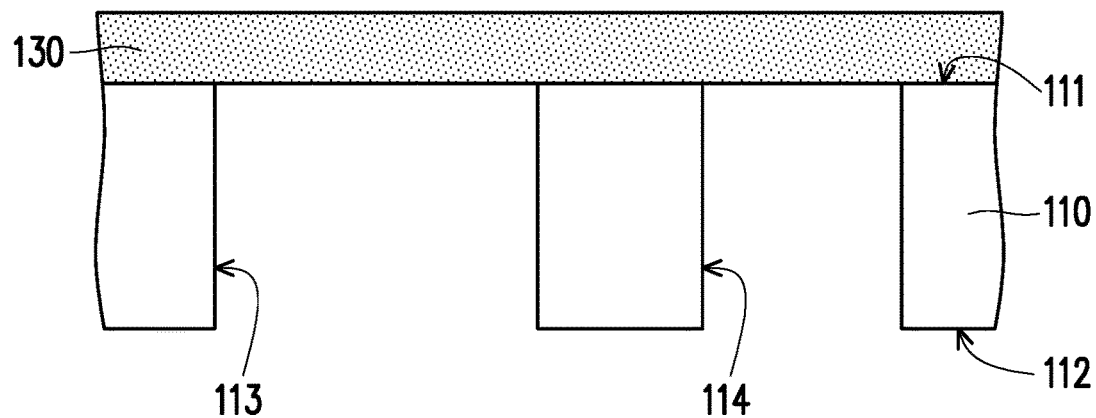
FIG. 2A to FIG. 2B are schematic cross-sectional views illustrating a manufacturing method of a carrier structure according to another embodiment of the invention.
Figure 2B:
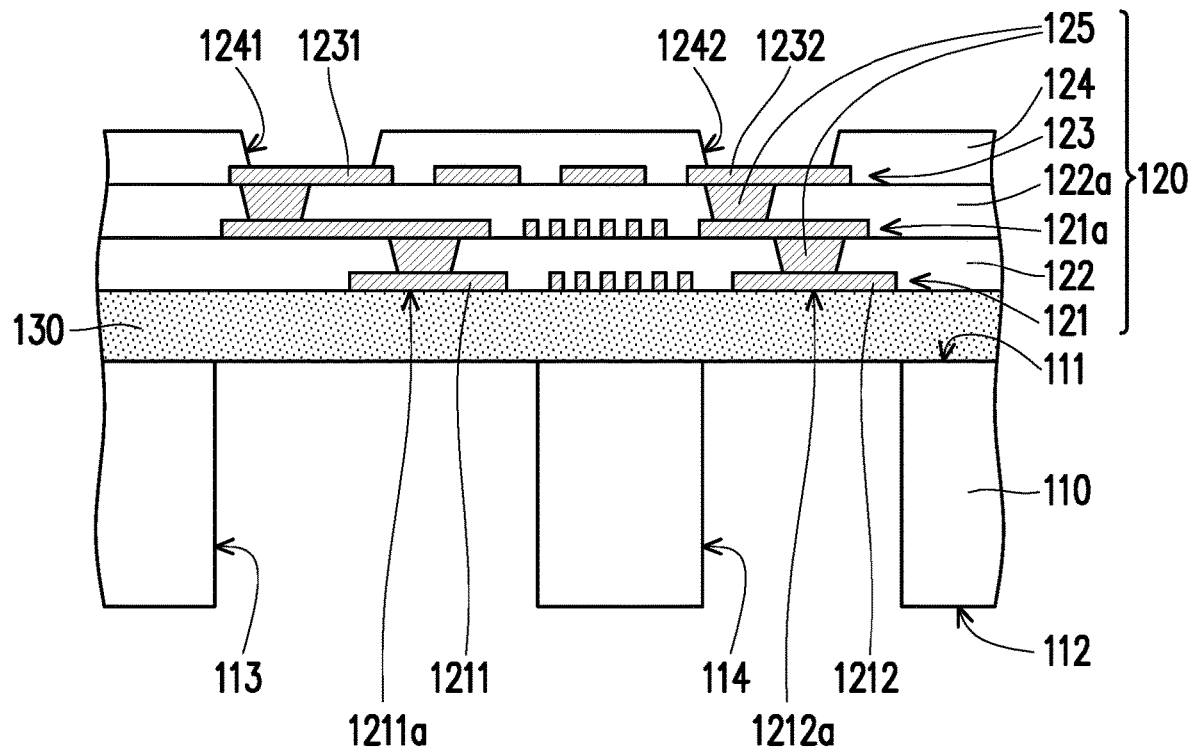

FIG. 2A to FIG. 2B are schematic cross-sectional views illustrating a manufacturing method of a carrier structure according to another embodiment of the invention. Referring to both FIG. 1A to FIG. 1B and FIG. 2A to FIG. 2B, the manufacturing method of the carrier structure in the present embodiment is similar to that in FIG. 1A to FIG. 1B. A main difference is as follows: According to a carrier structure 100a in the present embodiment, before the build-up circuit layer 120 is formed on the carrier 110, a connecting layer 130 is formed on the carrier 110, so that the connecting layer 130 may be located between the carrier 110 and the build-up circuit layer 120.

In particular, in the manufacturing method of the carrier structure in the present embodiment, a carrier 110 is first provided according to the steps in FIG. 1A. Next, referring to FIG. 2A, a connecting layer 130 is formed on a first surface 111 of the carrier 110, so that the connecting layer 130 covers the through holes 113 and 114. The connecting layer 130 is in contact with the first surface 111 of the carrier 110. In the present embodiment, the connecting layer 130 is made of, for example, an anisotropic conductive adhesive or a nano conductive polymer, but the invention is not limited thereto, provided that the connecting layer 130 is conductive in a vertical direction but non-conductive in a horizontal direction.

Next, referring to FIG. 2B, a build-up circuit layer 120 is formed on the connecting layer 130. In particular, in the present embodiment, the build-up circuit layer 120 may be directly formed on the connecting layer 130. Alternatively, a build-up circuit layer may be first formed on another substrate, and then the manufactured build-up circuit layer is disposed on the connecting layer 130. The build-up circuit layer is formed in a manner similar to the manner of forming the build-up circuit layer 120 in FIG. 1B, and therefore the descriptions thereof are omitted herein. In the present embodiment, the connecting layer 130 may be in direct contact with the first pads 1211 and 1212 adjacent to the connecting layer 130 in the build-up circuit layer 120. Therefore, during short-circuit or open-circuit electrical detection on the build-up circuit layer 120, upper endpoints may be the second pads 1231 and 1232, and lower endpoints may be electrically connected to the corresponding first pads 1211 and 1212 through the connecting layer 130. Therefore, in the present embodiment, through the disposed transient connecting layer 130, extraction of a fine line of the build-up circuit layer 120 and testing pads (that is, the first pads 1211 and 1212) for testing the lower points may be enhanced, thereby facilitating electrical detection on a product.

FIG. 3 to FIG. 6 are schematic cross-sectional views illustrating a carrier structure according to a plurality of embodiments of the invention. Referring to both FIG. 2B and FIG. 3, a carrier structure 100b in the present embodiment is similar to the carrier structure 100a in FIG. 2B. A main difference between the two carrier structures is that the carrier structure 100b in the present embodiment further includes at least one conductive pad 140 and 141. The conductive pads 140 and 141 have top surfaces 140a and 141a and bottom surfaces 140b and 141b opposite to the top surfaces 140a and 141a.

Figure 3:
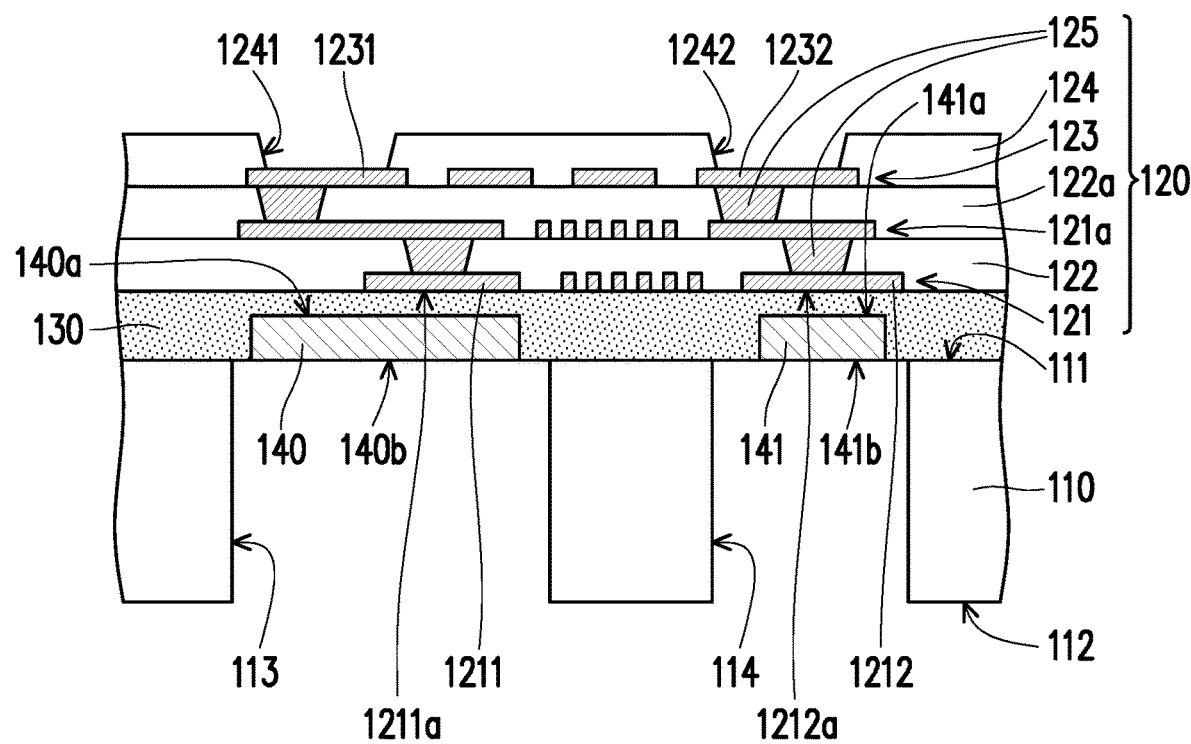
FIG. 3 to FIG. 6 are schematic cross-sectional views illustrating a carrier structure according to a plurality of embodiments of the invention.
Figure 4:
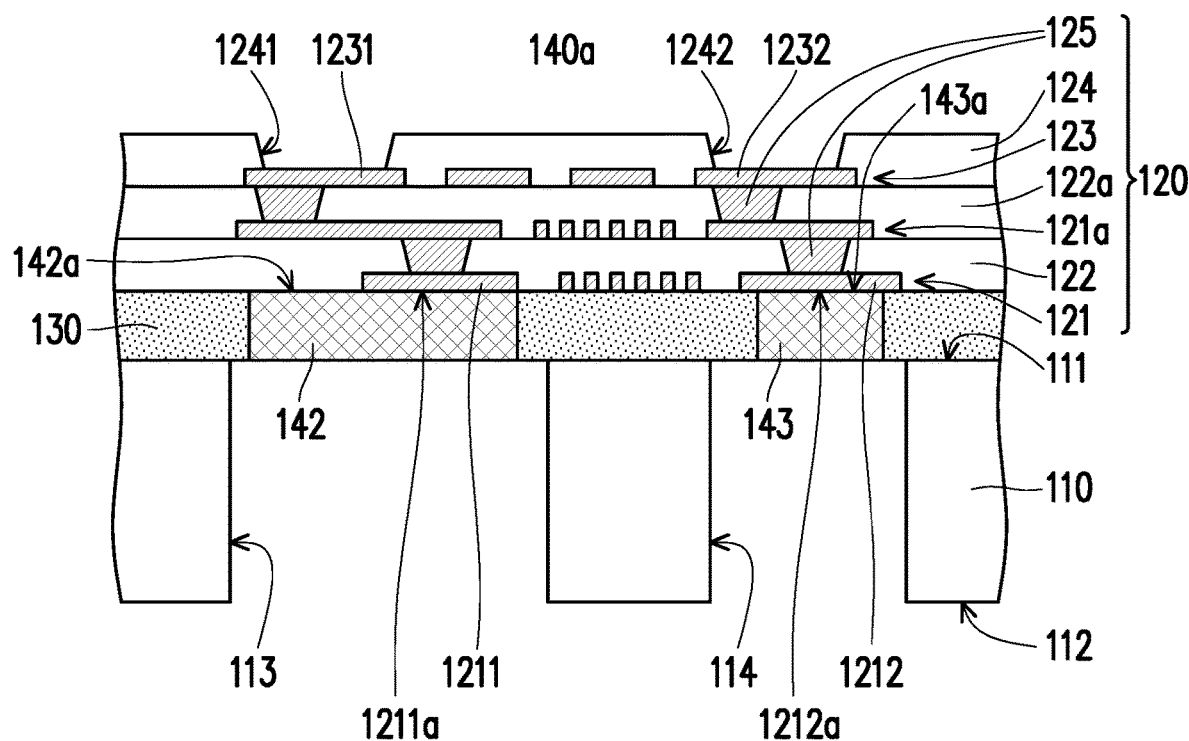

In particular, referring to FIG. 3, before the connecting layer 130 is formed between the carrier 110 and the build-up circuit layer 120, the conductive pads 140 and 141 are formed on the carrier 110. In the present embodiment, the conductive pads 140 and 141 are located between the carrier 110 and the build-up circuit layer 120, the conductive pads 140 and 141 are covered by the connecting layer 130, and the connecting layer 130 covers the top surfaces 140a and 141a of the conductive pads 140 and 141. The conductive pad 140 is disposed relative to the through hole 113, and the conductive pad 141 is disposed relative to the through hole 114. The bottom surface 140b of the conductive pad 140 may be aligned with the first surface 111 of the carrier 110, and the bottom surface 141b of the conductive pad 141 may be aligned with the first surface 111 of the carrier 110. In the present embodiment, the conductive pads 140 and 141 are electrically connected to the first pads 1211 and 1212 through the connecting layer 130, but the invention is not limited thereto. In some embodiments, in a carrier structure 100c shown in FIG. 4, a top surface 142a of a conductive pad 142 may also be in direct contact with the first pad 1211, and a top surface 143a of a conductive pad 143 may also be in direct contact with the first pad 1212, so that a conduction effect is better and a stress is dispersed. The conductive pads 140, 141, 142, and 143 herein are made of, for example, copper, but the invention is not limited thereto.

Figure 5:
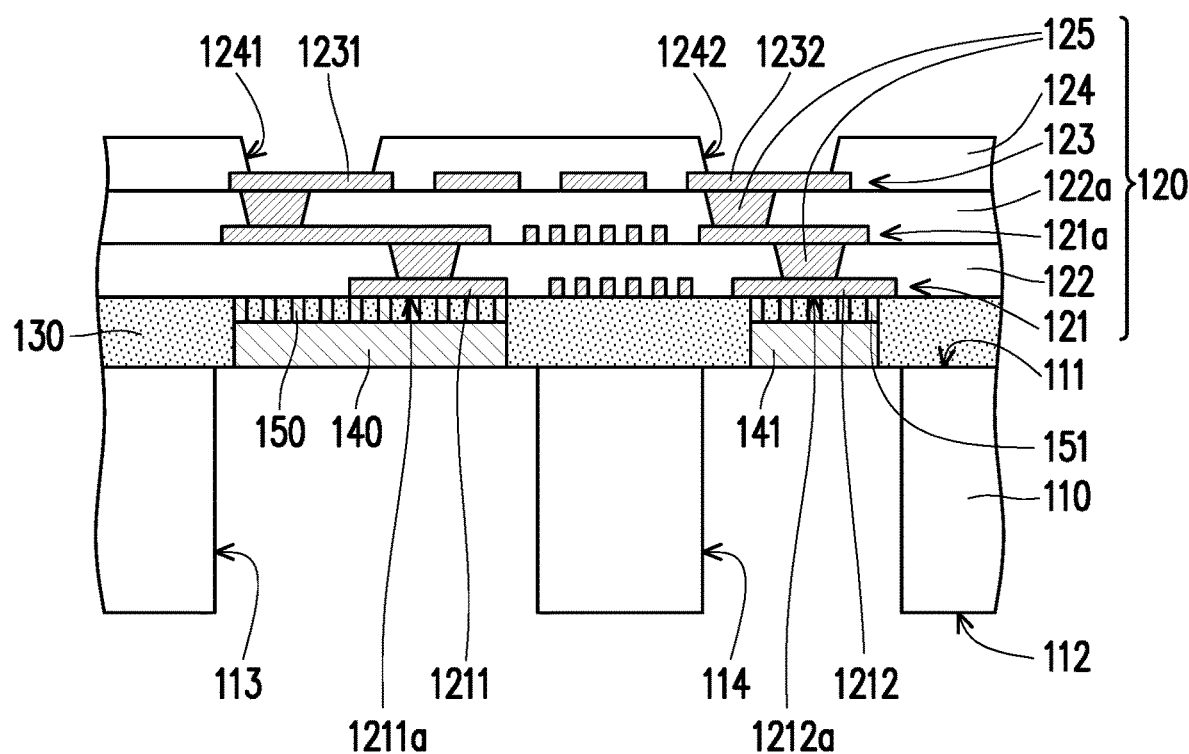

Referring to both FIG. 3 and FIG. 5, a carrier structure 100d in the present embodiment is similar to the carrier structure 100b in FIG. 3. A main difference between the two carrier structures is that the carrier structure 100d in the present embodiment further includes a plurality of conductive pillars 150 and 151.

In particular, referring to FIG. 5, after the conductive pads 140 and 141 are formed on the carrier 110, a plurality of conductive pillars 150 and 151 are formed on the conductive pads 140 and 141. The conductive pillars 150 and 151 are disposed between the conductive pads 140 and 141 and the build-up circuit layer 120, so that the conductive pillars 150 and 151 are electrically connected to the conductive pads 140 and 141 and the first pads 1211 and 1212. In some embodiments, two ends of the conductive pillars 150 and 151 may be in direct contact with the first pads 1211 and 1212 and the conductive pads 140 and 141 respectively, so that a conduction effect is better and a stress is dispersed. In some embodiments, since the conductive pads 140 and 141 are electrically connected to the first pads 1211 and 1212 through the conductive pillars 150 and 151, the connecting layer 130 may also be made of a non-conductive material.

Figure 6:
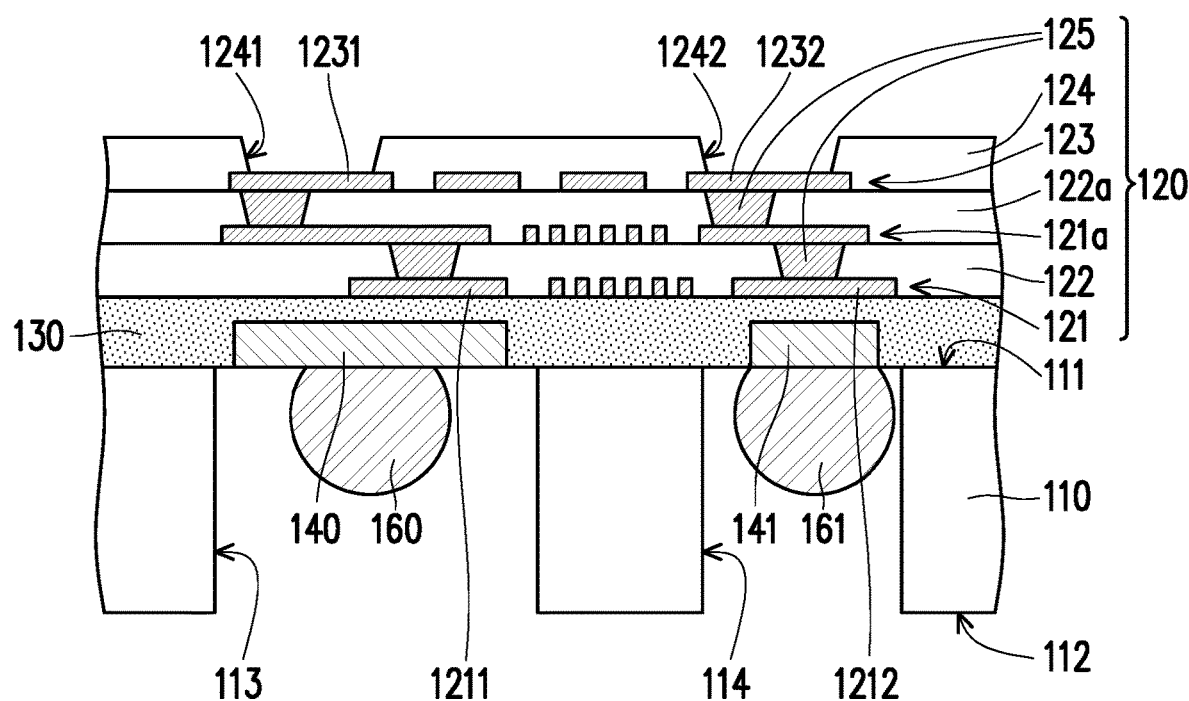

Referring to both FIG. 3 and FIG. 6, a carrier structure 100e in the present embodiment is similar to the carrier structure 100b in FIG. 3. A main difference between the two carrier structures is that the carrier structure 100e in the present embodiment further includes connecting terminals 160 and 161. The connecting terminals 160 and 161 are respectively disposed in the through holes 113 and 114 of the carrier 110 to be electrically connected to the conductive pads 140 and 141. In the present embodiment, the connecting terminals 160 and 161 are, for example, solder balls, but the invention is not limited thereto. In the present embodiment, the connecting terminals 160 and 161 are made of, for example, tin, but the invention is not limited thereto.

In the present embodiment, although the carrier 110 is not removed after it is determined through electrical detection that the circuit in the build-up circuit layer 120 is not shorted or open, and the connecting terminals 160 and 161 are disposed in the through holes 113 and 114 of the carrier 110 for subsequent use, the invention is not limited thereto. In some embodiments, the carrier 110 is optionally removed, so that the removed carrier 110 may be reused.

In view of the foregoing, according to the carrier structure and the manufacturing method thereof in the present embodiment, the first pad may be electrically connected to the corresponding second pad through the conductive via and the first circuit layer, the first pad is exposed from the through hole, and the second pad is exposed from the second dielectric layer. Therefore, after the build-up circuit layer is manufactured, short-circuit or open-circuit detection may be performed on upper and lower endpoints of the build-up circuit layer, that is, the first pad (that is, the lower endpoint) and the corresponding second pad (that is, the upper endpoint), to detect whether there is a problem in a manufacturing process of the circuit. Therefore, the carrier structure and the manufacturing method thereof in the present embodiment may be used to detect whether a circuit is shorted or open, so that the carrier substrate is relatively reliable.

What is claimed is:

1. A carrier structure, comprising:
   a carrier comprising a first surface, a second surface opposite to the first surface, and at least one through hole penetrating the carrier;
   a build-up circuit layer located on the carrier and comprising:
      at least one first circuit layer located on the first surface of the carrier and comprising at least one first pad, wherein the at least one first pad is disposed relative to the at least one through hole;
      at least one first dielectric layer located on the at least one first circuit layer;
      a second circuit layer located on at least one the first dielectric layer and comprising at least one second pad;
      a second dielectric layer located on the second circuit layer and comprising at least one opening, wherein the at least one opening exposes the at least one second pad; and
      a plurality of conductive vias penetrating the at least one first dielectric layer and electrically connected to the at least one first circuit layer and the second circuit layer; and
   a connecting layer located between the carrier and the build-up circuit layer and covering the at least one through hole, wherein the connecting layer is made of a material comprising an anisotropic conductive adhesive.

2. The carrier structure according to claim 1, wherein the connecting layer is in direct contact with the at least one first pad in the build-up circuit layer.

3. The carrier structure according to claim 1, further comprising:
   at least one conductive pad comprising a top surface and a bottom surface opposite to the top surface, located between the carrier and the build-up circuit layer, and covered by the connecting layer, wherein the at least one conductive pad is disposed relative to the at least one through hole.

4. The carrier structure according to claim 3, wherein the bottom surface of the at least one conductive pad is aligned with the first surface of the carrier.

5. The carrier structure according to claim 4, wherein the top surface of the at least one conductive pad is in direct contact with the at least one first pad.

6. The carrier structure according to claim 3, wherein the at least one conductive pad is electrically connected to the at least one first pad through the connecting layer.

7. The carrier structure according to claim 3, further comprising:
 a plurality of conductive pillars disposed between the at least one conductive pad and the build-up circuit layer and connected to the at least one conductive pad and the at least one first pad.

8. The carrier structure according to claim 1, wherein the at least one first circuit layer and the second circuit layer are fine lines, and a thickness of each of the at least one first dielectric layer and the second dielectric layer is from 4 microns to 10 microns.

\* \* \* \* \*